United States Patent
Levanon et al.

(10) Patent No.: US 8,198,011 B2
(45) Date of Patent: *Jun. 12, 2012

(54) METHOD OF IMAGING AND DEVELOPING POSITIVE-WORKING IMAGEABLE ELEMENTS

(75) Inventors: Moshe Levanon, Ness-Ziona (IL); Moshe Nakash, Ramat Hashron (IL); Tanya Kurtser, Petach Tiqwa (IL)

(73) Assignee: Eastman Kodak Company, Rochester, NY (US)

( * ) Notice: Subject to any disclaimer, the term of this patent is extended or adjusted under 35 U.S.C. 154(b) by 491 days.

This patent is subject to a terminal disclaimer.

(21) Appl. No.: 12/025,089

(22) Filed: Feb. 4, 2008

(65) Prior Publication Data

US 2009/0197052 A1    Aug. 6, 2009

(51) Int. Cl.
G03F 7/00 (2006.01)
G03F 7/26 (2006.01)

(52) U.S. Cl. ............ 430/302; 430/270.1; 430/919; 101/453

(58) Field of Classification Search .......... 430/270.1, 430/302
See application file for complete search history.

(56) References Cited

U.S. PATENT DOCUMENTS

| | | | |
|---|---|---|---|
| 6,255,033 B1 * | 7/2001 | Levanon et al. | 430/275.1 |
| 6,410,203 B1 | 6/2002 | Nakamura | |
| 6,541,181 B1 * | 4/2003 | Levanon et al. | 430/275.1 |
| 6,716,569 B2 * | 4/2004 | Hotta et al. | 430/302 |
| 7,078,162 B2 * | 7/2006 | Miller et al. | 430/331 |
| 7,399,576 B1 * | 7/2008 | Levanon | 430/302 |
| 7,723,012 B2 * | 5/2010 | Levanon et al. | 430/302 |
| 2003/0129506 A1 * | 7/2003 | Pappas et al. | 430/9 |
| 2005/0003296 A1 * | 1/2005 | Memetea et al. | 430/270.1 |
| 2005/0287468 A1 * | 12/2005 | Goodin | 430/192 |
| 2008/0008956 A1 * | 1/2008 | Levanon et al. | 430/270.1 |
| 2008/0160452 A1 * | 7/2008 | Takahashi | 430/309 |

FOREIGN PATENT DOCUMENTS

| | | | |
|---|---|---|---|
| JP | 11-065126 | * | 3/1999 |
| JP | 2006 018203 A | | 1/2006 |
| WO | WO 01/09682 A | | 2/2001 |
| WO | 2004/081662 | | 9/2004 |

OTHER PUBLICATIONS

U.S. Appl. No. 11/677,599, filed Feb. 22, 2007 Radiation-Sensitive Compositions and Elements With Basic Development Enhancers, by Moshe Levanon et al.
U.S. Appl. No. 11/769,766, filed Jun. 28, 2007 Radiation-Sensitive Compositions and Elements With Solvent Resistant Poly(Vinyl Acetal)S, by Moshe Levanon et al.
U.S. Appl. No. 11/959,492, filed Dec. 19, 2007 titled Radiation-Sensitive Elements With Developability-Enhancing Compounds, by Moshe Levanon et al.

* cited by examiner

*Primary Examiner* — Cynthia Kelly
*Assistant Examiner* — Chanceity Robinson
(74) *Attorney, Agent, or Firm* — J Lanny Tucker

(57) ABSTRACT

A method of making imaged elements such as lithographic printing plates is achieved by imagewise exposing a positive-working imageable element using energy of less than 300 mJ/cm$^2$ to provide exposed and non-exposed regions. The imaged element is developed using an alkaline, silicate-free solution containing a carbonate to remove predominantly only the exposed regions to provide an image. The imageable element comprises a substrate and a radiation absorbing compound, and has an imageable layer on the substrate that comprises a developability-enhancing compound and a poly(vinyl acetal) in which at least 25 mol % of its recurring units comprise pendant nitro-substituted phenolic groups.

14 Claims, No Drawings

METHOD OF IMAGING AND DEVELOPING POSITIVE-WORKING IMAGEABLE ELEMENTS

FIELD OF THE INVENTION

This invention relates to method of preparing imaged elements such as lithographic printing plates from positive-working imageable elements containing unique poly(vinyl acetal) binders using carbonate developers.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Imageable elements useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

Similarly, positive-working compositions can be used to form resist patterns in printed circuit board (PCB) production, thick-and-thin film circuits, resistors, capacitors, and inductors, multichip devices, integrated circuits, and active semiconductive devices.

"Laser direct imaging" methods (LDI) have been known that directly form an offset printing plate or printing circuit board using digital data from a computer, and provide numerous advantages over the previous processes using masking photographic films. There has been considerable development in this field from more efficient lasers, improved imageable compositions and components thereof.

Thermally sensitive imageable elements can be classified as those that undergo chemical transformation(s) in response to, exposure to, or adsorption of, suitable amounts of thermal energy. The nature of thermally induced chemical transformation may be to ablate the imageable composition in the element, or to change its solubility in a particular developer, or to change the tackiness or hydrophilicity or hydrophobicity of the surface layer of the thermally sensitive layer. As such, thermal imaging can be used to expose predetermined regions of an imageable layer that can serve as a lithographic printing surface or resist pattern in PCB production.

Positive-working imageable compositions containing novolak or other phenolic polymeric binders and diazoquinone imaging components have been prevalent in the lithographic printing plate and photoresist industries for many years. Imageable compositions based on various phenolic resins and infrared radiation absorbing compounds are also well known.

WO 2004/081662 (Memetea et al.) describes the use of various developability-enhancing compounds of acidic nature with phenolic polymers or poly(vinyl acetals) to enhance the sensitivity of positive-working compositions and elements so that required imaging energy is reduced. Some of the particularly useful poly(vinyl acetals) for such compositions and elements are described in U.S. Pat. No. 6,255,033 (Levanon et al.) and U.S. Pat. No. 6,541,181 (Levanon et al.).

Thermally imageable elements containing certain developability-enhancing materials and poly(vinyl acetal)s are described in copending and commonly assigned U.S. Ser. No. 11/677,599 (filed Feb. 22, 2007 by Levanon, Postel, Rubin, and Kurtser), U.S. Ser. No. 11/769,766 (filed Jun. 28, 2007 by Levanon, Lurie, and Kampel), and U.S. Ser. No. 11/959,492 (filed Dec. 18, 2007 by Nakash and Levanon).

Imageable elements containing phenolic resins are described in U.S. Pat. No. 6,410,203 (Nakamura). After imaging, the elements are developed with any of a variety of developers including silicate-containing, carbonate, phosphate, and borate developers.

PROBLEM TO BE SOLVED

Positive-working imageable elements are generally imaged and developed using various highly alkaline developers that contain silicates or metasilicates. While such developers are effective to remove imaged portions of the imageable layer, they can react undesirably with aluminum substrates and generate toxic waste solutions that create problems for disposal. Moreover, the silicates may accumulate in pipes and other parts of the processing apparatus. There is a need to find a more environmentally acceptable and less costly way to develop imaged positive-working imageable elements, especially those having a single imageable layer containing poly(vinyl acetal) binder resins.

SUMMARY OF THE INVENTION

The present invention provides a method of making art imaged element comprising:

A) imagewise exposing a positive-working imageable element using an energy of less than 300 mJ/cm$^2$ to provide exposed and non-exposed regions, and B) developing the imagewise exposed element with an alkaline, silicate-free solution containing a carbonate to remove predominantly only the exposed regions to provide an image in the exposed and developed element, the imageable element comprising a substrate and a radiation absorbing compound, and having on the substrate, an imageable layer comprising a developability-enhancing compound, and a poly(vinyl acetal) in which at least 25 mol % of its recurring units comprise pendant nitro-substituted phenolic groups.

In some embodiments, the method of making a lithographic printing plate comprises:

A) imagewise exposing a positive-working printing plate precursor using an energy of from about 100 to about 250 mJ/cm$^2$ to provide exposed and non-exposed regions, and B) developing the imagewise exposed printing plate precursor with an alkaline, silicate-free solution having a pH of from about 9.5 to about 11 and comprising from about 0.5 to about 5 weight % carbonate ion, to remove predominantly only the exposed regions to provide an image in the resulting lithographic printing plate, the lithographic printing plate precursor comprising an aluminum-containing substrate having thereon an imageable layer comprising an infrared radiation absorbing compound, a developability-enhancing compound, and a poly(vinyl acetal) that is represented by the following Structure (I):

(I)

wherein:

A represents recurring units represented by the following Structure (Ia):

B represents recurring units represented by the following Structure (Ib):

C represents recurring units represented by the following Structure (Ic):

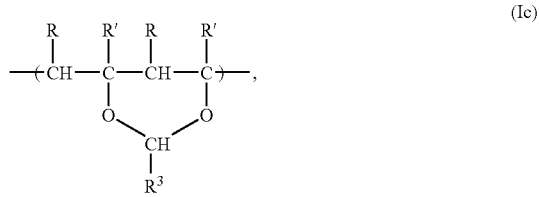

D represents recurring units represented by the following Structure (Id):

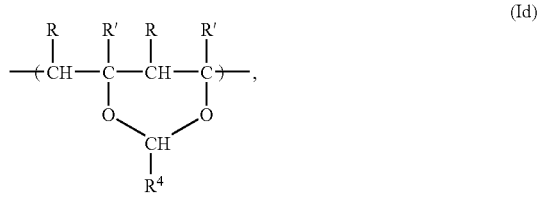

k is from about 1 to about 20 mol %, l is from about 5 to about 50 mol %, m is from about 10 to about 80 mol %, and n is from 0 to about 40 mol %, R and R' are independently hydrogen or a substituted or unsubstituted alkyl, substituted or unsubstituted cycloalkyl, or halo group, $R^1$ is a substituted or unsubstituted alkyl or aryl carboxylic acid ester, $R^2$ is hydroxy group, $R^3$ is a nitro-substituted phenol, nitro-substituted naphthol, or nitro-substituted anthracenol group, and $R^4$ is a substituted or unsubstituted alkyl, substituted or unsubstituted cycloalkyl, or substituted or unsubstituted aryl group.

This invention can be used to provide an imaged element such as a lithographic printing plate having an aluminum-containing hydrophilic substrate.

The present invention provides imaged elements from highly sensitive positive-working precursors in a manner that is more environmentally acceptable. The problems associated with known highly alkaline, silicate-containing developers are avoided. In addition, the developing conditions are relatively mild compared to those used in known methods. These advantages are achieved by using a relatively dilute carbonate developer.

DETAILED DESCRIPTION OF THE INVENTIONS

Definitions

Unless the context otherwise indicates, when used herein, the terms "radiation-sensitive composition", "imageable element", "positive-working imageable element are meant to be references to embodiments useful in the present invention.

In addition, unless the context indicates otherwise, the various components described herein such as "poly(vinyl acetal)", "radiation absorbing compound", and "developability-enhancing compound" also refer to mixtures of such components. Thus, the use of the articles "a", "an", and "the" is not necessarily meant to refer to only a single component.

Unless otherwise indicated, percentages refer to percents by weight that are based equivalently on the total solids of a radiation-sensitive composition or formulation, or the dry coating weight of a layer.

The term "single-layer imageable element" refers to an imageable element having only one layer for imaging, but as pointed out in more detail below, such elements may also include one or more layers under or over (such as a topcoat) the imageable layer to provide various properties.

As used herein, the term "radiation absorbing compound" refers to compounds that are sensitive to certain wavelengths of radiation and can convert photons into heat within the layer in which they are disposed. These compounds may also be known as "photothermal conversion materials", "sensitizers", or "light to heat converters".

For clarification of definition of any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any different definitions set forth herein should be regarded as controlling.

The term "polymer" (for example, polyvinyl acetal) refers to high and low molecular weight polymers including oligomers and includes both homopolymers and copolymers.

The term "copolymer" refers to polymers that are derived from two or more different monomers, or have two or more different recurring units, even if derived from the same monomer.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction of some other means.

Uses

The radiation-sensitive compositions and imageable elements described herein can be used to form resist patterns in printed circuit board (PCB) production, thick-and-thin film circuits, resistors, capacitors, and inductors, multi-chip devices, integrated circuits, and active semi-conductive devices. In addition, they can be used to provide lithographic printing plates having substrates with hydrophilic surfaces. Other uses would be readily apparent to one skilled in the art.

Radiation-Sensitive Compositions and Imageable Elements

The radiation-sensitive compositions include one or more aqueous alkaline solvent (developer) soluble poly(vinyl acetal) polymeric binders as the primary polymeric binders. The weight average molecular weight (Mw) of the poly(vinyl acetal)s is generally at least 5,000 and can be up to 150,000, and typically it is from about 20,000 to about 60,000, as measured using standard procedures. The optimal Mw may vary with the specific class of polymer and its use.

The poly(vinyl acetal)s may be the only binders in the radiation-sensitive composition (or imageable layer) but more generally, they comprise at least 10 weight %, and more typically at least 50 weight % and up to 100 weight %, based on the dry weight of all polymeric binders. In some embodiments, the amount of poly(vinyl acetal)s may be from about 50 to about 90 weight %, based on the dry weight of all polymeric binders.

For example, the useful polymeric binders are poly(vinyl acetal)s that comprise at least 25 and up to 80 mol % of recurring units represented by the following Structure (Ic);

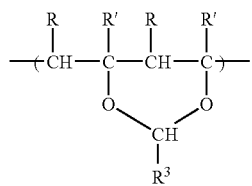

wherein R and R' are independently hydrogen or a substituted or unsubstituted alkyl, substituted or unsubstituted cycloalkyl, or halo group (as defined in more detail below).

$R^3$ is a nitro-substituted phenol, nitro-substituted naphthol, or nitro-substituted anthracenol group. There may be 1 to 3 nitro groups on these aromatic rings, but typically there is only one nitro group. These phenol, naphthol and anthracenol groups can optionally have additional substituents besides the nitro group(s). Such substituents include but are not limited to hydroxy, methoxy and other alkoxy groups, aryloxy, thioaryloxy, halomethyl, trihalomethyl, halo, azo, thiohydroxy, thioalkoxy, cyano, amino, carboxy, ethenyl, carboxyalkyl, phenyl, alkyl, alkenyl, alkynyl, cycloalkyl, aryl, heteroaryl, and heteroalicyclic groups. For example, $R^3$ can be a nitro-substituted phenol or nitro-substituted naphthol group that also includes one or more hydroxy or halo substituents.

More specifically, the useful poly(vinyl acetal) resins can be represented by the following Structure (I):

wherein:

A represents recurring units represented by the following Structure (Ia):

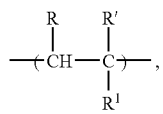

B represents recurring units represented by the following Stricture (Ib):

C represents recurring units represented by the Structure (Ic) as defined above, D represents recurring units represented by the following Structure (Id):

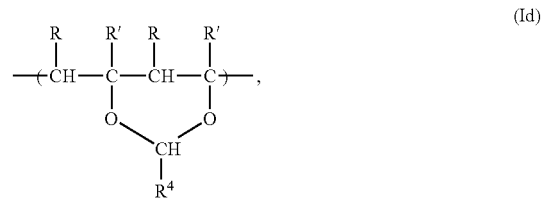

k is from about 1 to about 20 mol % (typically from about 2 to about 12 mol %), l is from about 5 to about 50 mol % (typically from about 20 to about 35 mol %), m is from about 25 to about 80 mol % (typically from about 35 to about 70 mol %), and n is from 0 to about 40 mol % (typically from about 10 to about 30 mol %).

R and R' are independently hydrogen, or a substituted or unsubstituted linear or branched alkyl group having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl and iso-hexyl groups), or substituted or unsubstituted cycloalkyl ring having 3 to 6 carbon atoms in the ring (such as cyclopropyl, cyclobutyl, cyclopentyl, methylcyclohexyl, and cyclohexyl groups), or a halo group (such as fluoro, chloro, bromo, or iodo). Typically, R and R' are independently hydrogen, or a substituted or unsubstituted methyl or chloro group, or for example, they are independently hydrogen or unsubstituted methyl. It is to be understood that the R and R' groups for different recurring units in the polymeric binder can be the same or different groups chosen from the noted definition.

In Structure (I), $R^1$ is a substituted or unsubstituted alkyl or aryl carboxylic acid ester, for example, having the formula —OC(=O)—$R^5$ wherein $R^5$ is a substituted or unsubstituted alkyl group having 1 to 12 carbon atoms (linear or branched) or a substituted or unsubstituted aryl group having 6 or 10 carbon atoms in the aromatic ring, except such aryl groups are not substituted with nitro groups. Typically, $R^5$ is a substituted or unsubstituted alkyl group having 1 to 6 carbon atoms such as an unsubstituted methyl group.

$R^2$ is hydroxy group.

$R^4$ is a substituted or unsubstituted, linear or branched alkyl group having 1 to 12 carbon atoms (such as methyl, ethyl, n-propyl, iso-propyl, t-butyl, n-butyl, n-pentyl, n-hexyl, n-heptyl, n-octyl, n-nonyl, n-decyl, n-undecyl, n-dodecyl, methoxymethyl, chloromethyl, trichloromethyl, benzyl, cinnamoyl, iso-propyl, iso-butyl, s-butyl, t-butyl, iso-pentyl, neo-pentyl, 1-methylbutyl, and iso-hexyl groups), substituted or unsubstituted cycloalkyl ring having 3 to 6 carbon atoms in the ring (such as cyclopropyl, cyclobutyl, cyclopentyl, methylcyclohexyl, and cyclohexyl groups), or a substituted or unsubstituted aryl group having 6 or 10 carbon atoms in the aromatic ring (such as substituted or unsubstituted phenyl and naphthyl groups, including phenyl, xylyl, tolulyl, p-methoxyphenyl, 3-chlorophenyl, and naphthyl) other than a phenol or naphthol. Typically, $R^4$ is a substituted or unsubstituted alkyl group having 1 to 6 carbon atoms such as n-propyl.

As indicated by the ratios of recurring units in Structure (I), the poly(vinyl acetals) may be at least trimers depending upon the numbers of different recurring units present. For example, there may be multiple different types of recurring units from any of the defined classes of recurring units, of Structures (Ia) through (Id). For example, a poly(vinyl acetal) of Structure (I) may have Structure (Ia) recurring units with different $R^1$ groups. Such multiplicity of recurring units can also be true for those represented by any of Structures (Ib) through (Id).

A polymeric binder represented by Structure (I) may contain recurring units other than those defined by Structures (Ia), (Ib), (Ic), and (Id), and such recurring units would be readily apparent to a skilled worker in the art. Thus, Structure (I) in its broadest sense is not limited to the defined recurring units, but in some embodiments, only the recurring units in Structure (I) are present. Other possible recurring units are described for example in U.S. Pat. No. 6,255,033 (noted above) as well as the noted U.S. Ser. Nos. 11/677,599, 11/769, 766, and 11/959,492.

Content of the poly(vinyl acetal) in the radiation-sensitive composition that forms a radiation-sensitive or imageable layer is generally from about 10 to about 99% of the total dry weight, and typically from about 30 to about 95% of the total dry weight. Many embodiments include the poly(vinyl acetal) in an amount of from about 50 to about 90% of the total composition or layer dry weight.

The poly(vinyl acetals) described herein can be prepared using known starting materials and reaction conditions including those described in U.S. Pat. No. 6,541,181 (noted above).

For example, acetalization of the polyvinyl alcohols takes place according to known standard methods for example as described in U.S. Pat. No. 4,665,124 (Dhillon et al.), U.S. Pat. No. 4,940,646 (Pawlowski), U.S. Pat. No. 5,169,898 (Walls et al.), U.S. Pat. No. 5,700,619 (Dwars et al.), and U.S. Pat. No. 5,792,823 (Kim et al.), and in Japanese Kokai 09-328,519 (Yoshinaga).

This acetalization reaction generally requires addition of a strong inorganic or organic catalyst acid. Examples of catalyst acids are hydrochloric acid, sulfuric acid, phosphoric acid, and p-toluenesulfonic acid. Other strong acids are also useful such as perfluoroalkylsulfonic acid and other perfluoro-activated acids. The amount of acid should effectively allow protonation to occur, but will not significantly alter the final product by causing unwanted hydrolysis of the acetal groups. The reaction temperature of the acetalization depends on the kind of aldehyde as well as the desired level of substitution. It is between 0° C. and, if applicable, the boiling point of the solvent. Organic solvents as well as mixtures of water with organic solvents are used for the reaction. For example, suitable organic solvents are alcohols (such as methanol, ethanol, propanol, butanol, and glycol ether), cyclic ethers (such as 1,4-dioxane), and dipolar aprotic solvents (such as N,N-dimethylformamid, N-methyl pyrrolidone or dimethyl sulfoxide). If acetalization is carried out in organic solvents or mixtures of organic solvents with water, the reaction product often remains in solution even if the starting polyvinyl alcohol was not completely dissolved. Incomplete dissolution of the starting polyvinyl alcohol in organic solvents is a disadvantage that may lead to irreproducible degree of conversion and different products. Water or mixtures of organic solvents with water should be used to achieve complete dissolution of polyvinyl alcohol and reproducible products as a result of acetalization. The sequence of the addition of the various acetalization agents is often of no importance and comparable finished products are obtained from different preparation sequences. To isolate the finished products as a solid, the polymer solution is introduced into a non-solvent under vigorous stirring, filtered off and dried. Water is especially suitable as a non-solvent for the polymers.

Unwanted hydrolysis of the acetal group achieved by acetalization with hydroxyl-substituted aromatic aldehydes takes place much easier than for the acetals built from aliphatic or not substituted aromatic aldehydes or from aldehydes containing carboxylic moieties at the same synthesis conditions. The presence of even a small amount of water in the reaction mixture leads to decreased degree of acetalization and incomplete conversion of the aromatic hydroxy aldehyde used. On the other hand, it was found that in the absence of water, the hydroxy-substituted aromatic aldehydes react with hydroxyl groups of alcohols immediately and with almost 100% conversion. So, the process of acetalization of polyvinyl alcohols by hydroxy-substituted aromatic aldehydes to achieve the desired polyvinyl acetals according can be carried out different from the procedures known in the art. The water can be removed from the reaction mixture during the synthesis by distillation under reduced pressure anti replaced with an organic solvent. The remaining water may be removed by addition to the mixture an organic material readily reactive with water and as a result of the reaction producing volatile materials or inert compounds. These materials may be chosen from carbonates, orthoesters of carbonic or carboxylic acids, which easily react with water, silica-containing compounds, such as diethylcarbonate, trimethyl orthoformate, tetraethyl carbonate, and tetraethyl silicate. The addition of these materials to reaction mixture leads to 100% conversion of the used aldehydes.

Thus, the preparation of a useful poly(vinyl acetal) can begin with dissolving of the starting polyvinyl alcohol in DMSO at 80-90° C., then the solution is chilled to 60° C., and the acidic catalyst dissolved in an organic solvent is added. Then the solution of the aliphatic aldehyde in the same solvent is added to the solution, the solution is kept for 30 minutes at 60° C., and a solution of the aromatic aldehyde and/or carboxylic substituted aldehyde, or other aldehyde in the same solvent is added. Anisole is added to the reaction mixture, and the azeothropic mixture of water with the anisole is removed by distillation and is replaced by the organic solvent. At this stage, the conversion of the aromatic hydroxy aldehyde reaches 95-98%. The acid in the reaction mixture is neutralized and the mixture is blended with water to precipitate the polymer that is filtrated, washed with water, and dried. A second way to achieve 100% of conversion of the aromatic hydroxyaldehyde to benzal is to add the water removing organic material (for example, a carbonate or orthoformate) after addition of the aldehydes to the reaction mixture.

There may be various phenolic resins as "secondary" polymers in the imageable layer in admixture with the poly(vinyl acetal) resins.

Phenolic resins can include but are not limited to, novolak resins such as condensation polymers of phenol and formaldehyde, condensation polymers of m-cresol and formaldehyde, condensation polymers of p-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Novolak resins having a weight average molecular weight of at least 1500 and a number average molecular weight of at least 300 are useful. Generally, the weight average molecular weight is in the range of from about 3,000 to about 300,000, the number average molecular weight is from about 500 to about 250,000, and the degree of dispersion (weight average molecular weight/number average molecular weight) is in the range of from about 1.1 to about 10.

Certain mixtures of the primary polymeric binders described above can be used, including mixtures of one or more poly(vinyl acetals) and one or more phenolic resins. For example, mixtures of one or more poly(vinyl acetals) and one or more novolak or resol (or resole) resins (or both novolak and resol resins) can be used.

Other useful resins include polyvinyl compounds having phenolic hydroxyl groups, include poly(hydroxystyrene)s and copolymers containing recurring units of a hydroxystyrene and polymers and copolymers containing recurring units of substituted hydroxystyrenes.

Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon, J. Ray, K. Ray, Postel, and Korionoff) that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000, preferably from about 1,000 to about 10,000, and more preferably from about 3,000 to about 7,000. In addition, they may have a polydispersity less than 2 and preferably from about 1.5 to about 1.9. The branched poly(hydroxystyrenes) can be homopolymers or copolymers with non-branched hydroxystyrene recurring units.

Still other "secondary" polymeric binders include the following classes of polymers having an acidic group in (1) through (5) shown below on a main chain and/or side chain (pendant group).

(1) sulfone amide (—$SO_2NH$—R),
(2) substituted sulfonamido based acid group (hereinafter, referred to as active imido group) [such as —$SO_2NHCOR$, $SO_2NHSO_2R$, —$CONHSO_2R$],
(3) carboxylic acid group (—$CO_2H$),
(4) sulfonic acid group (—$SO_3H$), and
(5) phosphoric acid group (—$OPO_3H_2$).

R in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfoneamide group such as m-aminosulfonylphenyl methacrylate, N-(p-aminosulfonylphenyl)methacrylamide, or N-(p-aminosulfonylphenyl)acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula

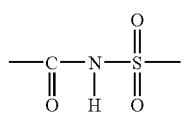

N-(p-toluenesulfonyl)methacrylamide and N-(p-toluenesulfonyl)acrylamide are examples of such polymerizable compounds.

Secondary polymeric binders having any of the groups (3) through (5) include, those readily prepared by reacting ethylenically unsaturated polymerizable monomers having the desired acidic groups, or groups that can be converted to such acidic groups after polymerization.

Regarding the minimum constituent units having an acidic group that is selected from the (1) through (5), there is no need to use only one kind of acidic group in the polymer, and in some embodiments, it may be useful to have at least two kinds of acidic groups. Obviously, not every recurring unit in the secondary polymeric binder must have one of the acidic groups, but usually at least 10 mol % and typically at least 20 mol % comprise the recurring units having one of the noted acidic groups.

The secondary polymeric binder can have a weight average molecular weight of at least 2,000 and a number average molecular weight of at least 500. Typically, the weight average molecular weight is from about 5,000 to about 300,000, the number average molecular weight is from about 800 to about 250,000, and the degree of dispersion (weight average molecular weight/number average molecular weight) is from about 1.1 to about 10.

Mixtures of the secondary polymeric binders may be used with the one or more poly(vinyl acetal) polymeric binders. The secondary polymeric binder(s) can be present in an amount of at least 1 weight % and up to 50 weight %, and typically from about 5 to about 30 weight %, based on the dry weight of the total polymeric binders in the radiation-sensitive composition or imageable layer.

The radiation-sensitive composition further comprises a developability-enhancing compound that can be selected from one or more classes of compounds. For example, useful developability enhancing compounds are described in WO 2004/081662 (noted above).

Other useful developability-enhancing compounds are organic acids (particularly aromatic acid) that are substituted with one or more amino groups and one or more carboxylic acid (carboxy) group. Such groups can be connected through one or more aliphatic or aromatic groups. For example, the amino groups can be directly connected to alkylene, arylene, and cycloalkylene groups as defined in more detail below. In addition, the amino group can be part of an aromatic or non-aromatic heterocyclic N-containing ring. Up to 4 of each of the amino and carboxylic acid groups may be present in the developability-enhancing compound molecule, and particularly, at least one amino group can be present and directly attached to a substituted or unsubstituted aryl group (such as a substituted or unsubstituted phenyl group).

Representative developability-enhancing compounds can be defined by the following Structure (DEC):

$$[HO\!-\!C(\!=\!O)]_m\text{-}A\text{-}[N(R_1)(R_2)]_n \quad\quad (DEC)$$

In Structure DEC, $R_1$ and $R_2$ can be the same or different hydrogen or substituted or unsubstituted, linear or branched alkyl groups having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, and iso-hexyl groups), substituted or unsubstituted cycloalkyl groups having 5 to 10 carbon atoms in the hydrocarbon ring, or substituted or unsubstituted aryl groups having 6, 10, or 14 carbon atoms in the aromatic ring. In some embodiments, $R_1$ and $R_2$ can be the same or different substituted or unsubstituted aryl groups (such as phenyl or naphthyl groups), and it is particularly useful that at least one of $R_1$ and $R_2$ is a substituted or unsubstituted aryl group when A includes an alkylene group directly connected to $-[N(R_1)(R_2)]_n$.

In other embodiments, $R_1$ and $R_2$ in Structure (DEC) can be the same or different hydrogen or substituted or unsubstituted, linear or branched alkyl groups having 1 to 6 carbon atoms (as noted above), substituted or unsubstituted cyclohexyl groups, or substituted or unsubstituted phenol or naphthyl groups.

In Structure (DEC), A is a substituted or unsubstituted organic linking group having at least one carbon, nitrogen, sulfur, or oxygen atom in the chain, wherein A also comprises a substituted or unsubstituted arylene group (such as a substituted or unsubstituted phenylene group) directly connected to $-[N(R_1)(R_2)]_n$. Thus, A can include one or more arylene (for example, having 6 or 10 carbon atoms in the aromatic ring), cycloalkylene (for example, having 5 to 10 carbon atoms in the carbocyclic ring), alkylene (for example, having 1 to 12 carbon atoms in the chain, including linear and branched groups), oxy, thio, amido, carbonyl, carbonamido, sulfonamido, ethenylene ($-\!CH\!=\!CH\!-$), ethinylene ($-\!C\!\equiv\!C\!-$), and seleno groups, or any combination thereof. In some particularly useful embodiments, A consists of a substituted or unsubstituted arylene group (such as a substituted or unsubstituted phenylene group).

In Structure (DEC), m is an integer of 1 to 4 (typically 1 or 2) and n is an integer of 1 to 4 (typically 1 or 2), wherein m and n can be the same or different.

In still other embodiments, the developability-enhancing compounds can be defined by the following Structure (DEC$_1$):

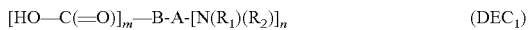

$$[HO\!-\!C(\!=\!O)]_m\text{-}B\text{-}A\text{-}[N(R_1)(R_2)]_n \quad\quad (DEC_1)$$

wherein $R_1$ and $R_2$ are as defined above, A is an organic linking group having a substituted or unsubstituted phenylene directly attached to $-[N(R_1)(R_2)]_n$, B is a single bond or an organic linking group having at least one carbon, oxygen, sulfur, or nitrogen atom in the chain, m is an integer of 1 or 2, n is an integer of 1 or 2. The "B" organic linking group can be defined the same as A is defined above except that it is not required that B contain an arylene group, and usually B, if present, is different than A.

The aryl (and arylene), cycloalkyl, and alkyl (and alkylene) groups described herein can have optionally up to 4 substituents including but not limited to, hydroxy, methoxy and other alkoxy groups, aryloxy groups such phenyloxy, thioaryloxy groups, halomethyl, trihalomethyl, halo, nitro, azo, thiohydroxy, thioalkoxy groups such as thiomethyl, cyano, amino, carboxy, ethenyl and other alkenyl groups, carboxyalkyl, aryl groups such as phenyl, alkyl groups, alkynyl, cycloalkyl, heteroaryl, and heteroalicyclic groups.

The imageable elements can include one or more aminobenzoic acids, dimethylaminobenzoic acids, aminosalicylic acids, indole acetic acids, anilinodiacetic acids, N-phenyl glycine, or any combination thereof as developability-enhancing compounds. For example, such compounds can include but are not limited to, 4-aminobenzoic acid, 4-(N,N'-dimethylamino)benzoic acid, anilinodiacetic acid, N-phenyl glycine, 3-indoleacetic acid, and 4-aminosalicyclic acid.

Still other useful developability enhancing compounds are acidic developability-enhancing compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides since such a combination may permit further improved developing latitude and printing durability. Representative examples of such compounds are provided in [0030] to [0036] of U.S. Patent Application Publication 2005/0214677 (noted above) that is incorporated herein by reference with respect to these acid developability-enhancing compounds.

Still again, the developability-enhancing compounds can be the basic developability-enhancing compounds described in copending and commonly assigned U.S. Ser. No. 11/677,599 (noted above), incorporated herein by reference for these compounds. Such compounds can be defined by the following Structure (BDEC):

$$(R^7)_s\!-\!N\!-\![(CR^8R^9)_t\!-\!OH]_v \quad\quad (BDEC)$$

wherein t is 1 to 6, s is 0, 1, or 2, and v is 1 to 3, provided that the sum of s and v is 3. When s is 1, $R^7$ is hydrogen or an alkyl, alkylamine, cycloalkyl, heterocycloalkyl, aryl, arylamine, or heteroaryl group, and when s is 2, the multiple $R^7$ groups can be the same or different alkyl, alkylamine, cycloalkyl, heterocycloalkyl, aryl, arylamine, or heteroaryl groups, or the two $R^7$ groups together with the nitrogen atom, can form a substituted or unsubstituted heterocyclic ring. $R^8$ and $R^9$ are independently hydrogen or an alkyl group.

Examples of such organic BDEC compounds are N-(2-hydroxyethyl)-2-pyrrolidone, 1-(2-hydroxyethyl)piperazine, N-phenyldiethanolamine, triethanolamine, 2-[bis(2-hydroxyethyl)amino]-2-hydroxymethyl-1,3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Mixtures of two or more of these compounds are also useful.

The radiation-sensitive composition can include other optional addenda as described below for the imageable layer.

In general, the imageable elements are formed by suitable application of a formulation of the radiation-sensitive composition that contains one or more polymeric binders including one or more poly(vinyl acetal) resins, one or more developability-enhancing compounds, and a radiation absorbing compound (described below), as well as other optional addenda (such as phenolic resins, contrast dyes, or both), to a suitable substrate to form an imageable layer. This substrate can be treated or coated in various ways as described below prior to application of the formulation. For example, the substrate can be treated to provide an "interlayer" for improved adhesion or hydrophilicity, and the imageable layer is applied over the interlayer.

The substrate generally has a hydrophilic surface, or a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that may be coated or treated using techniques known in the art, including physical graining, electrochemical graining and chemical graining, followed by anodizing. The aluminum sheet can be mechanically or electrochemically grained and anodized using phosphoric acid or sulfuric acid and conventional procedures.

An optional interlayer may be formed by treatment of the aluminum support with, for example, a silicate, dextrine, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution. The grained and anodized aluminum support can be treated with poly(acrylic acid) using known procedures to improve surface hydrophilicity.

The thickness of the substrate can be varied but should be sufficient to sustain the wear from printing and thin enough to wrap around a printing form. Some embodiments include a treated aluminum foil having a thickness of from about 100 μm to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer comprises one or more radiation absorbing compounds. While these compounds can be sensitive to any suitable energy form (for example, UV, visible, and IR radiation) from about 150 to about 1500 nm, they are typically sensitive to infrared radiation and thus, the radiation absorbing compounds are known as infrared radiation absorbing compounds ("IR absorbing compounds") that generally absorb radiation from about 600 to about 1400 nm and more likely, from about 700 to about 1200 nm. The imageable layer is generally the outermost layer in the imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, such as two sulfonic acid groups and two indolenine groups. Useful IR-sensitive cyanine dyes of this type are described for example in U.S. Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phosphor or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and typically the pigment particle size will be less than half the thickness of the imageable layer.

In the imageable elements, the radiation absorbing compound is generally present at a dry coverage of from about 0.1 to about 30 weight %, or typically from about 0.5 to about 20 weight %. The particular amount needed for this purpose would be readily apparent to one skilled in the art, depending upon the specific compound used.

Alternatively, the radiation absorbing compounds may be included in a separate layer that is in thermal contact with the single imageable layer. Thus, during imaging, the action of the radiation absorbing compound in the separate layer can be transferred to the imageable layer without the compound originally being incorporated into it.

The imageable layer can also include one or more additional compounds that act as colorant dyes. Colorant dyes that are soluble in an alkaline developer are useful. Useful polar groups for colorant dyes include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) areas in the developed imageable element.

When a colorant dye is present in the imageable layer, its amount can vary widely, but generally it is present in an amount of from about 0.5 weight % to about 30 weight % (based on the total dry layer weight).

The imageable layer can further include a variety of other additives including dispersing agents, humectants, biocides, plasticizers, nonionic or amphoteric surfactants for coatability or other properties (such as fluoropolymers), wear-resistant polymers (such as polyurethanes, polyesters, epoxy resins, polyamides, and acrylic resins), viscosity builders, fillers and extenders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts (for example, as described in US Patent Application Publication 2005/0214677 of Nagashima).

The positive-working imageable element can be prepared by applying the imageable layer formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the single imageable layer is from about 0.5 to about 3 g/m$^2$ or from about 1 to about 2 g/m$^2$.

The selection of solvents used to coat the layer formulation(s) depends upon the nature of the polymeric binders and other polymeric materials and non-polymeric components in the formulations. Generally, the imageable layer formulation is coated out of acetone, methyl ethyl ketone, or another ketone, tetrahydrofuran, 1-methoxy propan-2-ol (or 1-methoxy-2-propanol), N-methyl pyrrolidone, 1-methoxy-2-propyl acetate, γ-butyrolactone, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing and using positive-working single-layer imageable elements are described below in the examples.

After the imageable layer formulation is dried on the substrate (that is, the coating is self-supporting and dry to the touch), the element can be heat treated at from about 40 to about 90° C. (typically at from about 50 to about 70° C.) for at least 4 hours and typically at least 20 hours, or for at least 24 hours. The maximum heat treatment time can be as high as 96 hours, but the optimal time and temperature for the heat treatment can be readily determined by routine experimentation. Such heat treatments are described for example, in EP 823,327 (Nagasaka et al.) and EP 1,024,958 (McCullough et al.).

It may also be desirable that during the heat treatment, the imageable element is wrapped or encased in a water-impermeable sheet material to represent an effective barrier to moisture removal from the precursor. Further details of this conditioning process for individual, stacks, or coils of imageable elements are provided in U.S. Pat. No. 7,175,969 (Ray et al.).

Imaging and Development

The imageable elements used in the practice of this invention can have any useful form including, but not limited to, printing plate precursors, printing cylinders, printing sleeves and printing tapes (including flexible printing webs). For example, the imageable members are lithographic printing plate precursors designed to form lithographic printing plates.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

During use, the imageable elements are exposed to a suitable source of radiation such as UV, visible light, or infrared radiation, depending upon the radiation absorbing compound present in the radiation-sensitive composition, at a wavelength of from about 150 to about 1500 nm. For most embodiments, imaging is carried out using an infrared or near-infrared laser at a wavelength of from about 700 to about 1400 nm. The laser used to expose the imaging member can be a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

IR imaging speeds may be up to 300 mJ/cm$^2$, or typically from about 100 to about 250 mJ/cm$^2$.

Imaging is generally carried out using direct digital imaging. The image signals are stored as a bitmap data file on a computer. Such data files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer (described below) removes the exposed regions of the imageable layer and any layers underneath it, and exposing the hydrophilic surface of the substrate. Thus, such imageable elements are "positive-working" (for example, "positive-working" lithographic printing plate precursors).

Thus, development is carried out for a time sufficient to remove predominantly only the imaged (exposed) regions of the imageable layer, but as one skilled in the art would appreciate, not long enough to remove a significant amount of the non-imaged (non-exposed) regions of the imageable layer. The imaged (exposed) regions of the imageable layer are described as belong "soluble" or "removable" in the developer because they are removed, dissolved, or dispersed within the developer more readily than the non-imaged (non-exposed) regions of the imageable layer. The term "soluble" also means "dispersible".

The imaged elements are developed using a carbonate-containing developer that is free of silicates and metasilicates that are found in most conventional developers. This carbonate-containing developer generally has a pH of from about 9.5 to about 11 and typically from about 10 to about 10.8. Carbonate ion can be supplied from one or more sources such as alkali metal and ammonium carbonates, including but not limited to sodium carbonate and potassium carbonate. The carbonate concentration in the developer is generally at least 0.5 weight % and less than or equal to 5 weight % and typically from about 1 to about 3 weight %, and more typically from about 1 to about 2 weight %.

Development is generally carried out under moderate conditions. For example, development can be carried out for at least 0.5 and up to and including 3 minutes at up to 35° C., and typically from about 23 to about 28° C.

Generally, the developer is applied to the imaged element by rubbing or wiping it with an applicator containing the developer. Alternatively, the imaged element can be brushed with the developer or the developer may be applied by spraying the element with sufficient force to remove the exposed regions. Still again, the imaged element can be immersed in the developer.

Following development, the imaged element can be rinsed with water and dried in a suitable fashion. The dried element can also be treated with a conventional gumming solution (preferably gum arabic).

The imaged and developed element can also be baked in a post-exposure bake operation that can be carried out to increase run length of the resulting imaged element. Baking can be carried out, for example at from about 220° C. to about 240° C. for from about 0.5 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the imageable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are presented as a means to illustrate the practice of this invention but the invention is not intended to be limited thereby.

EXAMPLES

The following components were used in the preparation and use of the examples. Unless otherwise indicated, the components are available from Aldrich Chemical Company (Milwaukee, Wis.):

BF-03 represents a poly(vinyl alcohol), 98% hydrolyzed (Mw=15,000) that was obtained from Chang Chun Petrochemical Co. Ltd. (Taiwan).

Crystal Violet (C.I. 42555) is Basic Violet 3 or hexamethylpararosaniline chloride ($\lambda_{max}$=588 nm).

DMABA represents 4-(dimethylamino)benzoic acid.

DMSO represents dimethylsulfoxide.

LB 9900 is a resole resin that was obtained from Hexion Specialty Chemicals AG (Germany).

M-1 represents an aqueous solution of potassium carbonate (1 weight %), benzyl alcohol (1.5 weight %), 2-butoxy ethanol (1 weight %), and ethoxylated nonylphenol (NP12, 0.04 weight %).

M-2 represents an aqueous solution of potassium carbonate (1 weight %).

M-3 represents an aqueous solution of potassium carbonate (1.5 weight %).

MEK represents methyl ethyl ketone.

MSA represents methanesulfonic acid (99%).

Polyfox® PF 652 is a surfactant that was obtained from Omnova (Fairlawn, Ohio).

PM represents 1-methoxy-2-propanol (also known as Dowanol® PM available from Dow Chemical or as Arcosolve® PM available from LyondellBissel Industries).

S 0094 is an IR dye ($\lambda_{max}$=813 nm) that was obtained from FEW Chemicals (Germany).

Sudan Black B is a neutral diazo dye (C.U. 26150) that is available from Acros Organics (Geel, Belgium).

TEA represents triethanolamine.

Preparation of Polymer A:

BF-03 (50 g) was added to reaction vessel fitted with a water-cooled condenser, a dropping funnel, and thermometer, and containing DMSO (200 g). With continual stirring, the mixture was heated for 30 minutes at 80° C. until it became a clear solution. The temperature was then adjusted at 60° C. and MSA (2.7 g) in DMSO (50 g) was added. Over 15 minutes, a solution of butyraldehyde (10.4 g) was added to the reaction mixture and it was kept for 1 hour at 55-60° C. 2-Hydroxybenzaldehyde (salicylic aldehyde, 39 g) in DMSO (100 g) was added to the reaction mixture. The reaction mixture was then diluted with anisole (350 g) and vacuum distillation was started. The anisole:water azeotrope was distilled out from the reaction mixture (less than 0.1% of water remained in the solution). The reaction mixture was chilled to room temperature and was neutralized with TEA (8 g) dissolved in DMSO (30 g), then blended with 6 kg of water. The resulting precipitated polymer was washed with water, filtered, and dried in vacuum for 24 hours at 50° C. to obtain 86 g of dry Polymer A that had the molar ratio of recurring units shown in the following formula:

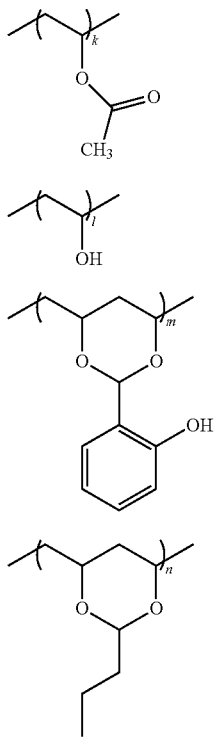

Polymer A k=2%, l=27%, m=48%, n=23%

Preparation of Polymer B:

BF-03 (20 g) was added to reaction vessel fitted with at water-cooled condenser, a dropping funnel and thermometer, containing DMSO (170 g). With continual stirring, the mixture was heated for 30 minutes at 80° C. until it became a clear solution. The temperature was then adjusted at 60° C. and MSA (1.0 g) was added. Over 15 minutes, a solution of butyraldehyde (4.0 g) in DMSO (20 g) was added to the reaction mixture and it was kept for 30 minutes at 55-60° C. 2-Hydroxy-5-nitro benzaldehyde (5-nitro-salicylic aldehyde, 18.78 g) and DMSO (40 g) were added to the reaction mixture that was then kept for 1 hour at 55-60° C. The reaction mixture was then diluted with anisole (140 g) and vacuum distillation was started. The anisole:water azeotrope was distilled out from the reaction mixture (less than 0.1% of water remain in the solution). The reaction mixture was chilled to room temperature and neutralized with TEA (2 g) dissolved in DMSO (120 g) and then blended with 3.2 kg of water. The resulting precipitated polymer was washed with water, filtered, and dried in vacuum for 24 hours at 50° C. to obtain 34.6 g of dry Polymer B. The molar ratio of the recurring units in Polymer B is shown below.

Preparation of Polymer C:

BF-03 (20 g) was added to reaction vessel fitted with a water-cooled condenser, a dropping funnel and thermometer, containing DMSO (170 g). With continual stirring, the mixture was heated for 30 minutes at 80° C. until it became a clear solution. The temperature was then adjusted at 60° C. and MSA (1.0 g) was added. Over 15 minutes, a solution of butyraldehyde (2.4 g) in DMSO (20 g) was added to the reaction mixture that was then kept for 30 minutes at 55-60° C. 2-Hydroxy-5-nitro benzaldehyde (5-nitro-salicylic aldehyde, 22.54 g) and DMSO (40 g) were added to the reaction mixture and it was then kept for 1 hour at 55-60° C. The reaction mixture was then diluted with anisole (140 g) and vacuum distillation was started. The anisole:water azeotrope was distilled out from the reaction mixture (less than 0.1% of water remain in the solution). The reaction mixture was chilled to room temperature and was neutralized with TEA (2 g) dissolved in DMSO (120 g), and then blended with 3.2 kg of water. The resulting precipitated polymer was washed with water, filtered, and dried in vacuum for 24 hours at 50° C. to obtain 36.2 g of dry Polymer C. The molar ratio of the repeating units is shown below.

Preparation of Polymer D:

BF-03 (20 g) was added to reaction vessel fitted with a water-cooled condenser, a dropping funnel and thermometer, containing DMSO (170 g). With continual stirring, the mixture was heated for 30 minutes at 80° C. until it became a clear solution. The temperature was then adjusted at 60° C. and MSA (1.0 g) was added. Over 15 minutes, a solution of butyraldehyde (5.6 g) in DMSO (20 g) was added to the reaction mixture that was kept for 30 minutes at 55-60° C. 2-Hydroxy-5-nitro benzaldehyde (5-nitro-salicylic aldehyde, 18.78 g) and DMSO (40 g) were added to the reaction mixture and it was then kept for 1 hour at 55-60° C. The reaction mixture was then diluted with anisole (140 g), and vacuum distillation was started. The anisole:water azeotrope was distilled out from the reaction mixture (less than 0.1% of water remain in the solution). The reaction mixture was chilled to room temperature and was neutralized with TEA (2 g) dissolved in DMSO (120 g) and then blended with 3.2 kg of water. The resulting precipitated polymer was washed with water, filtered, and dried in vacuum for 24 hours at 50° C. to obtain 29.7 g of dry Polymer D. The molar ratio of the recurring units is shown below.

Preparation of Polymer E:

BF-03 (20 g) was added to reaction vessel fitted with a water-cooled condenser, a dropping funnel and thermometer, containing DMSO (170 g). With continual stirring, the mixture was heated for 30 minutes at 80° C. until it became a clear solution. The temperature was then adjusted at 60° C. and MSA (1.0 g) was added, 2-Hydroxy-5-nitro benzaldehyde (5-nitro-salicylic aldehyde, 28.2 g) and DMSO (40 g) were added to the reaction mixture that was then kept for 1 hour at 55-60° C. The reaction mixture was then diluted with anisole (140 g) and vacuum distillation was started. The anisole: water azeotrope was distilled out from the reaction mixture (less than 0.1% of water remain in the solution). The reaction mixture was chilled to room temperature and was neutralized with TEA (2 g) dissolved in DMSO (120 g) and then blended with 3.2 kg of water. The resulting precipitated polymer was washed with water, filtered and dried in vacuum for 24 hours at 50° C. to obtain 36.3 g of dry Polymer E. The molar ratio of recurring units is shown below in the following Polymer Scheme.

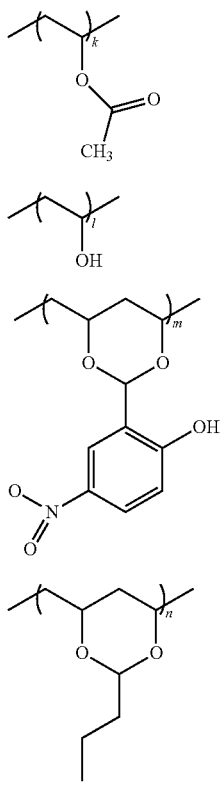

Polymer B k=2%, l=32%, m=45%, n=21%
Polymer C k=2%, l=32%, m=54%, n=12%
Polymer D k=2%, l=27%, m=42%, n=29%
Polymer E k=2%, l=33%, m=65%

Invention Example 1

An imageable element of the present invention was prepared in the following manner using the following radiation-sensitive composition formulation:

| | |
|---|---|
| Polymer B | 0.5536 g |
| LB 9900 (49% in PM) | 0.2449 g |
| S 0094 IR Dye | 0.0200 g |
| Crystal Violet | 0.0160 g |
| Sudan Black B | 0.0160 g |
| DMABA | 0.0720 g |
| Polyfox ® PF 652 (10% in PM) | 0.0240 g |
| MEK | 3.220 g |
| PM | 5.830 g |

The formulation was filtered and applied to an electrochemically roughened and anodized aluminum substrate that had been subjected to a treatment with an aqueous solution of sodium phosphate/sodium fluoride by means of common methods and the resulting imageable layer coating was dried for 30 seconds at 100° C. in Glunz&Jensen "Unigraph Quartz" oven. The dry coverage of the imageable layer was about 1.5 g/m². The single imageable layer was the outermost layer of the imageable element. The imageable element was conditioned with interleave paper for two days at 60° C. and 25% RH.

The resulting imageable element was exposed on a Kodak Lotem 400 Quantum imager in a range of energies of 60 mJ/cm² to 180 mJ/cm² and developed for 30 seconds at 26° C. in dish containing the M-1 Developer. The resulting printing plate was evaluated for sensitivity: Clearing Point (the lowest imaging energy at which the exposed regions were completely removed by the developer at a given temperature and time), Linearity Point (the energy at which the 50% dots at 200 lpi screen are reproduced as 50%±0.2% dots), and Cyan Density Loss in the non-exposed (non-imaged) regions that is a measure of coating weight loss in the non-exposed regions. The results are shown below in TABLE I.

Invention Example 2

Imageable elements were prepared, imaged and developed using the same general procedure described above for Invention Example 1, this time developing the plate for 30 sec at 24° C. and using the following radiation-sensitive composition formulation:

| | |
|---|---|
| Polymer C | 0.5536 g |
| LB 9900 (49% in PM) | 0.2449 g |
| S0094 IR Dye | 0.0200 g |
| Crystal Violet | 0.0160 g |
| Sudan Black B | 0.0160 g |
| DMABA | 0.0720 g |
| Polyfox ® PF 652 (10% in PM) | 0.0240 g |
| MEK | 3.220 g |
| PM | 5.830 g |

The results obtained for Invention Example 2 are shown below in TABLE I.

Invention Example 3

Imageable elements were prepared, imaged and developed using the same general procedure described above for the Invention Example 1, this time using the following coating solution:

| | |
|---|---|
| Polymer D | 0.5536 g |
| LB 9900 (49% in PM) | 0.2449 g |
| S0094 IR Dye | 0.0200 g |
| Crystal Violet | 0.0160 g |
| Sudan Black B | 0.0160 g |
| DMABA | 0.0720 g |
| Polyfox ® PF 652 (10% in PM) | 0.0240 g |
| MEK | 3.220 g |
| PM | 5.830 g |

The results obtained for Invention Example 3 are shown below in TABLE I.

Invention Example 4

Imageable elements were prepared, imaged and developed using the same general procedure described above for the Invention Example 1, this time using the following radiation-sensitive composition formulation.

| | |
|---|---|
| Polymer E | 0.5536 g |
| LB 9900 (49% in PM) | 0.2449 g |
| S0094 IR Dye | 0.0200 g |
| Crystal Violet | 0.0160 g |
| Sudan Black B | 0.0160 g |
| DMABA | 0.0720 g |
| Polyfox ® PF 652 (10% in PM) | 0.0240 g |

-continued

| | |
|---|---|
| MEK | 3.220 g |
| PM | 5.830 g |

The results obtained for Invention Example 4 are shown below in TABLE I.

Invention Example 5

Imageable elements were prepared, imaged and developed using the same general procedure described above for the Invention Example 1, but this time the imageable element was exposed in a range of energies of 150 mJ/cm$^2$ to 270 mJ/cm$^2$ and developed for 120 seconds at 26° C. in a dish containing the M-2 developer. The results obtained for Invention Example 5 are shown below in TABLE I.

Invention Example 6

Imageable elements were prepared, imaged and developed using the same general procedure described above for the Invention Example 1, but this time the imageable element was exposed in a range of energies of 150 mJ/cm$^2$ to 270 mJ/cm$^2$ and developed for 90 seconds at 26° C. in a dish containing the M-3 developer. The results obtained for Invention Example 6 are shown below in TABLE I.

Comparative Example 1

Imageable elements were prepared, imaged and developed using the same general procedure described above for the Invention Example 1, but by developing the imaged element for 3 minutes at 26° C. in the M-1, M-2 or M-3 developers. The element was prepared using the following radiation-sensitive composition formulation.

| | |
|---|---|
| Polymer A | 22.35 g |
| LB 9900 (49% in PM) | 23.41 g |
| S0094 IR Dye | 0.9600 g |
| Crystal Violet | 0.7700 g |
| Sudan Black B | 0.7700 g |
| DMABA | 2.300 g |
| Polyfox ® PF 652 (10% in PM) | 1.150 g |
| PM | 273.0 g |
| MEK | 154.5 g |

The results obtained for Comparative Example 1 are shown below in TABLE I.

The results in TABLE I show that, while an imageable element prepared using a formulation containing Polymer A cannot be developed with the carbonate-containing M-1, M-2, or M-3 developer (see Comparative Example 1 in TABLE I), imageable elements prepared using analogous formulations containing the nitro-substituted Polymer B (Invention Examples 1, 5 and 6), Polymer C (Invention Example 2), Polymer D (Invention Example 3), or Polymer E (Invention Example 4) were developed efficiently with the carbonate-containing M-1, M-2, or M-3 developer, thereby revealing the latent image (see Invention Examples 1-6 in TABLE I).

Comparing the results obtained for Invention Examples 1-4 with those obtained for Invention Examples 5 and 6 (TABLE I) demonstrates that the use of benzyl alcohol and 2-butoxy ethanol in the M-1 developer increased the sensitivity of the imageable element (lower clearing point) as well as the Cyan Density loss (higher "CDL").

The results in TABLE I also show that the reactivity of the nitro-substituted poly(vinyl acetal) resins and hence the speed at which the imaged elements were developed is in direct relation to the percentage of the nitro-substituted acetal recurring units C and in inverse relation to the percentage of the aliphatic acetal recurring units D (see polymer scheme above). The order of reactivity was as follows: Polymer E>>Polymer C>Polymer B>Polymer D.

The invention has been described in detail with particular reference to certain preferred embodiments thereof, but it will be understood that variations and modifications can be effected within the spirit and scope of the invention.

The invention claimed is:
1. A method of making an imaged element comprising:
A) imagewise exposing a positive-working imageable element using an energy of less than 300 mJ/cm$^2$ to provide exposed and non-exposed regions, and
B) developing said imagewise exposed element with an alkaline, silicate-free solution having a pH of from 9.5 to 11 and containing a carbonate to remove predominantly only said exposed regions to provide an image in said exposed and developed element, wherein said carbonate-containing solution comprises at least 0.5 and up to 5 weight % carbonate ion,
said imageable element comprising a substrate and a radiation absorbing compound, and having on said substrate, an imageable layer comprising a developability-enhancing compound and a poly(vinyl acetal) having recurring units represented by the following Structure (Ic) in an

TABLE I

| Imageable Element | Sensitivity (Clearing Point) mJ/cm$^2$ | Linearity Point (LP) mJ/cm$^2$ | Cyan Density Loss (CDL) (%) | Comments |
|---|---|---|---|---|
| Invention Example 1 (M-1 Developer at 26° C./30 sec) | 90 | 150 | 11 | |
| Invention Example 2 (M-1 Developer at 24° C./30 sec) | 90 | 150 | 7 | |
| Invention Example 3 (M-1 Developer at 26° C./30 sec) | 160 | 170 | 9 | |
| Invention Example 4 (M-1 Developer at 26° C./30 sec) | <60 | 120 | 12 | "Soft" coating, scratched and scrubbed |
| Invention Example 5 (M-2 Developer at 26° C./120 sec) | 150 | 200 | 0 | |
| Invention Example 6 (M-3 Developer at 26° C./90 sec) | 150 | 200 | 2 | |
| Comparative Example 1 (M-1, M-2, or M-3 Developers each at 26° C./180 sec) | — | — | — | No coating dissolution and no image observed | amount of at least 35 and up to and including 70 mol % of all recurring units in the polymer, and recurring units represented by the following Structure (Id) in an amount of from 0 and up to and including 30 mol % of all recurring units in the polymer,

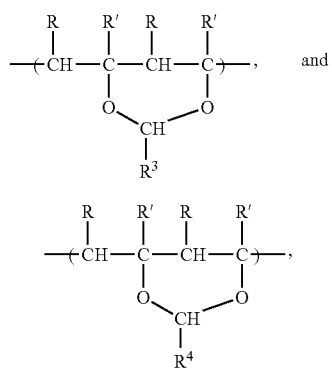

wherein R and R' are independently hydrogen or a substituted or unsubstituted alkyl, substituted or unsubstituted cycloalkyl, or halo group, $R^3$ is a nitro-substituted phenol, nitro-substituted naphthol, or nitro-substituted anthracenol group, and $R^4$ is a substituted or unsubstituted alkyl, substituted or unsubstituted cycloalkyl, or substituted or unsubstituted aryl group.

2. The method of claim 1 wherein said imagewise exposing is carried out at an energy of from about 100 to about 250 mJ/cm².

3. The method of claim 1 wherein said developing is carried out at up to 35° C. for up to and including 3 minutes.

4. The method of claim 1 wherein said poly(vinyl acetal) further comprises at least 1 and up to and including 20 mol % of recurring units from Structure (Ia) and at least 5 and up to and including 50 mol % of recurring units from Structure (Ib), based on total recurring units in the polymer,

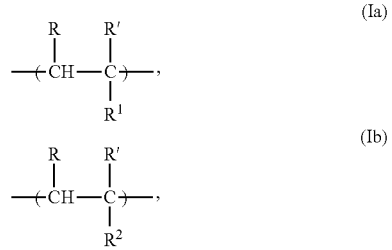

wherein R and R' are independently hydrogen or a substituted or unsubstituted alkyl, substituted or unsubstituted cycloalkyl, or halo group,
$R^1$ is a substituted or unsubstituted alkyl or aryl carboxylic acid ester, and
$R^2$ is hydroxy group.

5. The method of claim 4 wherein the recurring units from Structure (Ia) are from about 2 to about 12 mol %, the recurring units from Structure (Ib) are from about 20 to about 35 mol %, and the recurring units from Structure (Id) is from about 10 to about 30 mol %.

6. The method of claim 1 wherein said imageable element is imaged at a wavelength of from about 700 to about 1400 nm, and said imageable element comprises an infrared radiation absorbing compound in said imageable layer.

7. The method of claim 1 wherein said substrate contains aluminum and has a hydrophilic surface upon which said imageable layer is disposed.

8. The method of claim 1 wherein said imageable layer further comprises a phenolic resin, a contrast dye, or both.

9. A positive imaged element comprising a substrate and a radiation absorbing compound, and having on the substrate, an imageable layer comprising non-exposed regions that comprise a developability-enhancing compound and a poly(vinyl acetal) having recurring units represented by the following Structure (Ic) in an amount of at least 35 and up to and including 70 mol % of all recurring units in the polymer, and recurring units represented by the following Structure (Id) in an amount of from 0 and up to and including 30 mol % of all recurring units in the polymer,

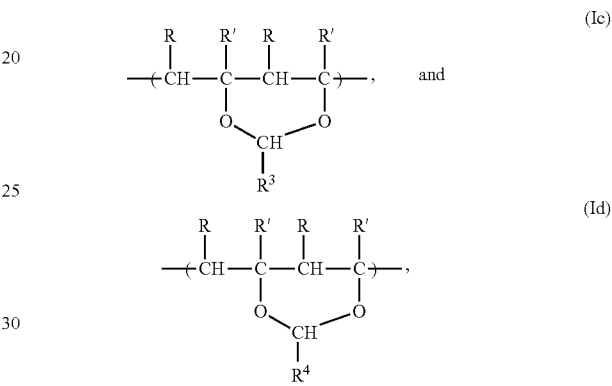

wherein R and R' are independently hydrogen or a substituted or unsubstituted alkyl, substituted or unsubstituted cycloalkyl, or halo group, $R^3$ is a nitro-substituted phenol, nitro-substituted naphthol, or nitro-substituted anthracenol group, and $R^4$ is a substituted or unsubstituted alkyl, substituted or unsubstituted cycloalkyl, or substituted or unsubstituted aryl group.

10. The imaged element of claim 9 that is a positive lithographic printing plate having an aluminum-containing hydrophilic substrate.

11. A method of making a lithographic printing plate comprising:

A) imagewise exposing a positive-working printing plate precursor using an energy of from about 100 to about 250 mJ/cm² to provide exposed and non-exposed regions, and B) developing said imagewise exposed printing plate precursor with an alkaline, silicate-free solution having a pH of from about 9.5 to about 11 and comprising from about 0.5 to about 5 weight % carbonate ion, to remove predominantly only said exposed regions to provide an image in the resulting lithographic printing plate, said lithographic printing plate precursor comprising an aluminum-containing substrate having thereon an imageable layer comprising an infrared radiation absorbing compound, a developability-enhancing compound, and a poly(vinyl acetal) having recurring units represented by the following Structure (Ic) in an amount of at least 35 and up to and including 70 mol % of all recurring units in the polymer, and recurring units represented by the following Structure (Id) in an amount of from 10 and up to and including 30 mol % of all recurring units in the polymer,

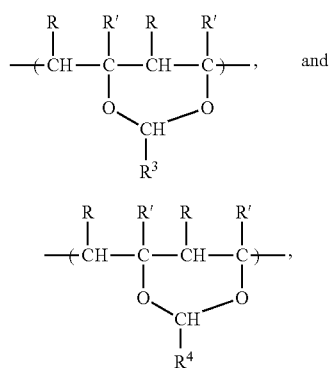

wherein R and R' are independently hydrogen or a substituted or unsubstituted alkyl, substituted or unsubstituted cycloalkyl, or halo group, $R^3$ is a nitro-substituted phenol, nitro-substituted naphthol, or nitro-substituted anthracenol group, and $R^4$ is a substituted or unsubstituted alkyl, substituted or unsubstituted cycloalkyl, or substituted or unsubstituted aryl group.

12. The method of claim 1 wherein the alkaline, silicate-free solution further comprises benzyl alcohol and 2-butoxy ethanol.

13. The method of claim 1 wherein the alkaline, silicate-free solution has a pH of from 10 to 10.8 and the carbonate concentration is from about 1 to about 3 weight %.

14. The method of claim 1 wherein the alkaline, silicate-free solution has a carbonate concentration of from about 1 to about 2 weight %.

* * * * *